(12) United States Patent
Pardoe et al.

(10) Patent No.: US 9,585,243 B1
(45) Date of Patent: Feb. 28, 2017

(54) CIRCUIT BOARDS AND METHODS OF IDENTIFICATION AND MANUFACTURING THEREOF

(71) Applicant: OCZ Storage Solutions, Inc., San Jose, CA (US)

(72) Inventors: Stephen K. Pardoe, Swindon (GB); Nigel Rowe, Berkshire (GB)

(73) Assignee: Toshiba Corporation, Tokyo (JP)

( * ) Notice: Subject to any disclaimer, the term of this patent is extended or adjusted under 35 U.S.C. 154(b) by 0 days.

(21) Appl. No.: 14/757,470

(22) Filed: Dec. 23, 2015

(51) Int. Cl.
*B32B 3/02* (2006.01)
*H05K 1/02* (2006.01)
*H05K 3/00* (2006.01)

(52) U.S. Cl.
CPC ......... *H05K 1/0266* (2013.01); *H05K 3/0047* (2013.01); *H05K 2203/0228* (2013.01)

(58) Field of Classification Search
CPC .......................... H05K 1/0266; H05K 3/0047
See application file for complete search history.

(56) References Cited

U.S. PATENT DOCUMENTS

2006/0157270 A1* 7/2006 Ueno ................... H05K 1/0266
174/250

* cited by examiner

*Primary Examiner* — Elizabeth Mulvaney
(74) *Attorney, Agent, or Firm* — White & Case LLP

(57) ABSTRACT

Methods of manufacturing circuit boards and circuit boards formed thereby to have a surface that is configured to receive circuitry and a notch of a selectable configuration in a lateral edge along the surface of the circuit board boards, and where the selectable configuration is configured to convey identifying information relating to the circuit boards. Such a circuit board can be produced from a panel containing one or more circuit boards, wherein at least one circuit board has a border adjoined and defined by a partition feature that is configured to enable the circuit board to be physically separated from other portions of the panel. Notches having the same of varying selectable configurations may be formed on the at least one circuit board during the manufacturing of the circuit board.

20 Claims, 9 Drawing Sheets

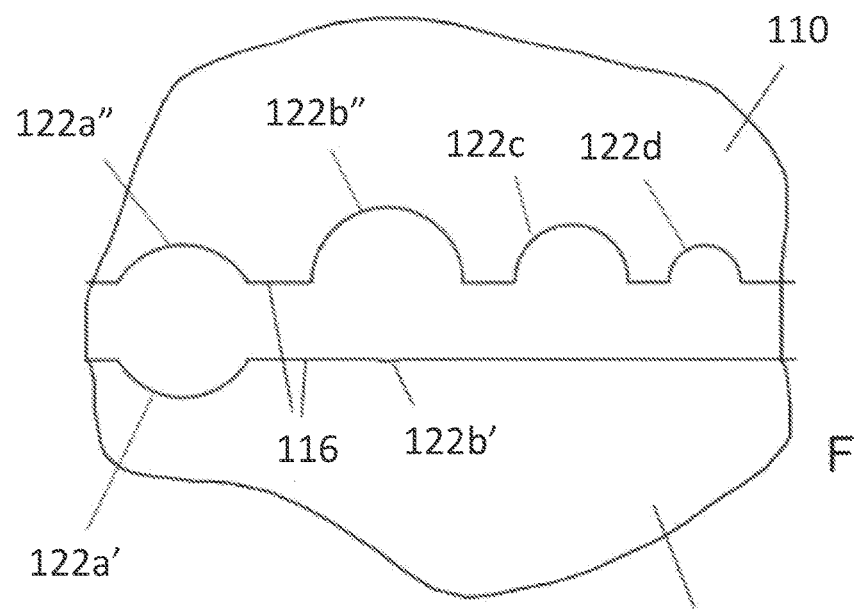
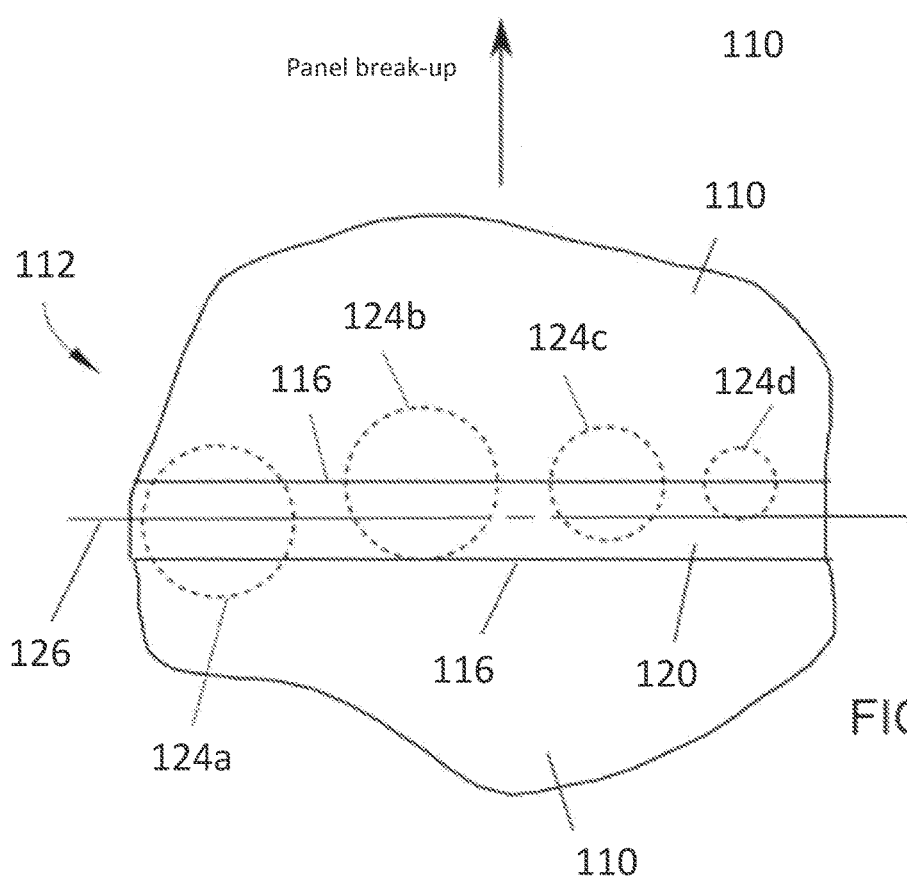
Panel break-up
FIG. 6B
FIG. 6A

CIRCUIT BOARDS AND METHODS OF IDENTIFICATION AND MANUFACTURING THEREOF

BACKGROUND OF THE INVENTION

The present invention generally relates to circuit boards. The invention particularly relates to methods of identifying circuit boards.

Printed circuit boards (PCBs) are often manufactured and assembled while part of an array of PCBs within a panel to enable multiple PCBs to be manufactured and assembled at the same time using automated processes. A panel may be in the form of a multilayer blank (board). The blank may comprise any suitable number of layers formed of various materials. For example, the blank may include a laminate base having a thin copper layer on one or more surfaces thereof. An image may be applied to surfaces of the blank representative of (as nonlimiting examples) traces and pads of the desired circuit board. Imaging is often performed with high intensity ultraviolet light and chemical processes known in the art. The resulting image effectively exposes portions of a copper layer of the blank while covering other portions of the copper layer. Etching processes are performed to remove the exposed portions and expose the laminate base thereunder. The remaining portions of the copper layer, which were covered during the etching process, generally define features such as traces and pads. An oxide coating may be applied to the remaining portions of the copper layer to improve adhesion to their surfaces. At this point, additional layers, including layers of copper foil, may be added to the blank through one or more lamination processes.

After various processes to prepare the blank for circuit components, the blank may then be marked to include, for example, component placement, part numbers or names, date codes, logos or other specified information relating to each board to be fabricated from the blank, after which various other processes may be performed on the blank to result in a multilayer blank suitable for producing the intended panel and its circuit boards.

The individual circuit boards within a panel often carry markings that may include the identity of the manufacturer, part numbers, board dimensions, model numbers, versions, date codes, and/or other identifying information capable of identifying the boards after they have been placed installed in a computing system. Conventionally, these identifying markings may be printed on components mounted to the circuit board and/or printed on portions of the circuit board surfaces that are not occupied with components, for example, by inking processes performed on outer layers of copper that were applied to the panel during its manufacture. These processes often add additional steps, time, and expense to the manufacturing process of a circuit board. In addition, as the sizes of circuit boards are reduced and denser component placement is sought, there is less space on circuit boards where identifying markings may be located and remain visible in the final circuit boards.

In view of the above, there is a long felt need for marking circuit boards with identifiers and/or other identifying information relating to the boards while reducing the additional steps and time, and associated expenses.

BRIEF DESCRIPTION OF THE INVENTION

The present invention provides methods of manufacturing circuit boards and circuit boards formed thereby.

According to one aspect of the invention, a circuit board includes a surface configured to receive circuitry and a first notch of a first selectable configuration formed in a first lateral edge of the surface, wherein the first selectable configuration is configured to convey identifying information that identifies aspects relating to the circuit board.

According to another aspect of the invention, a method of manufacturing at least a circuit board includes providing a first circuit board that includes a surface with a perimeter and forming a first notch having a first selectable configuration on or near the perimeter of the first circuit board such that at least a portion of the first notch is located within the surface of the first circuit board. The method further comprises configuring the first selectable configuration of the first notch in order to convey identifying information that identifies aspects relating to the first circuit board.

Other aspects and advantages of this invention will be better appreciated from the following detailed description.

BRIEF DESCRIPTION OF THE DRAWINGS

FIG. 1 represents a portion of a circuit board having an identification notch in an edge along a surface of the circuit board in accordance with a nonlimiting aspect of the invention.

FIG. 2 represents a portion of a circuit board having an identification notch and sub-notch in an edge along a surface of the circuit board in accordance with a nonlimiting aspect of the invention.

FIG. 3 represents a portion of a circuit board having a pattern of identification notches in an edge along a surface of the circuit board in accordance with a nonlimiting aspect of the invention.

FIGS. 4 and 5 represent examples of alternative patterns of identification notches in accordance with nonlimiting aspects of the invention.

FIGS. 6A and 6B represent additional examples of alternative patterns for forming identification notches in edges along surfaces of two adjacent circuit boards in accordance with a nonlimiting aspect of the invention.

FIGS. 7A through 7C, 8A through 8C, 9A through 9C, and 10A through 10C, represent steps performed during processes of manufacturing circuit boards to form identification notches in edges thereof in accordance with nonlimiting aspects of the invention.

DETAILED DESCRIPTION OF THE INVENTION

The present invention generally relates to novel circuit boards and methods of providing circuit boards with identifiers or markings that may be used to convey identifying information relating to a circuit board. As used herein, such identifying information includes but is not limited to the identity of the origin, features, aspects, components, etc., of a circuit board, for example, part number or name, model number, manufacturer, date code, production run, component placement, etc. In particular, the invention provides techniques through which notches can be formed in an edge of a circuit board during its manufacture, and techniques for utilizing such notches to represent identifying information that has been traditionally alphanumerically printed on surfaces of circuit boards. These techniques are particularly well suited for circuit boards that are processed within panels. It should be noted that the drawings are drawn for purposes of clarity when viewed in combination with the following description, and therefore are not necessarily to scale.

Figure 1:
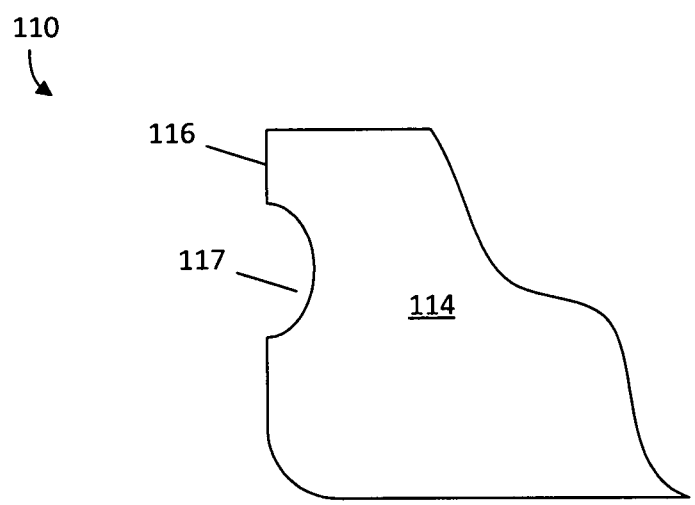

FIG. 1 represents a nonlimiting circuit board 110 having a notch or recess 117 formed in an edge 116 along a surface 114 of the circuit board 110 in accordance with certain aspects of the invention. In one embodiment, edge 116 is located along the perimeter of the surface 114, and therefore may be considered a lateral or outer edge of the surface 114 of the circuit board 110. Surface 114 is configured to receive circuitry of the circuit board 110. The notch 117 is shown as having a particular configuration: semicircular in shape, of a certain size, and positioned at a certain location on the lateral edge 116 of surface 114. However, the configuration of the notch 117 is adjustable based on the need for conveying identifying information of the circuit board 110. For example, the shape of the notch 117 may be formed into other shapes such as triangular, rectangular, or a combination of shapes. The location of the notch 117 may also vary. The notch 117 may be positioned anywhere along lateral edge 116, or even on other lateral edges of the circuit board 110. As can be understood, notches of the present invention have a selectable configuration and are therefore distinguishable from typical tabs associated with conventional scribe lines. These tabs are remnants of forming the circuit board 110 during the manufacturing process (e.g., separating the circuit board 110 from other circuit boards located within a panel). Such tabs have only a single shape and are located only at the corners of the circuit board 110. In contrast, the configuration of the notch 117 is selectable by the manufacturer and conveys useful identifying information regarding the circuit board 110. Moreover, the notch 117 is protected from damage because it is offset from the lateral edge 116 of the surface 114 of the board 110, and this lateral edge 116 will contact other items during manufacturing, assembly, and use of the board 110.

Figure 2:
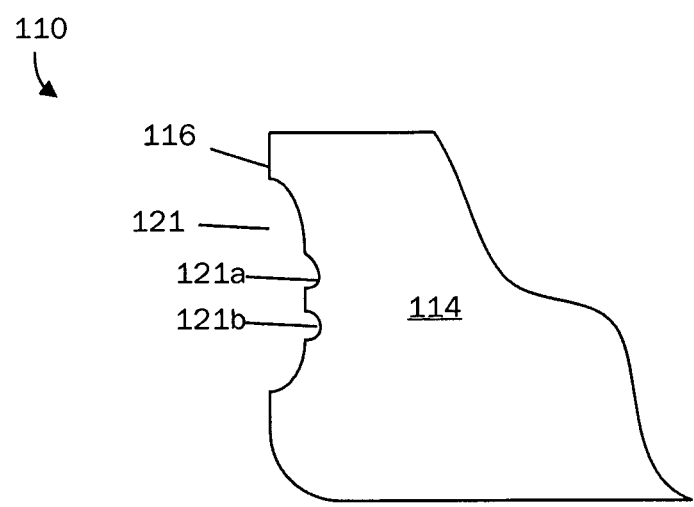

FIG. 2 represents another nonlimiting circuit board 110 having a single notch or recess 121, similar to the notch 117 shown in FIG. 1, but further including sub-notches 121a and 121b. The configurations of notch 121 and sub-notches 121a and 121b are adjustable based on the need for conveying the identifying the information of the circuit board 110. The shape, size, and/or location of notch 121 are adjustable in order to convey identifying information regarding the circuit board 110. Similarly, the configuration of sub-notches 121a and 121b, including the shape, size, location, and/or number of sub-notches, are adjustable, that in combination with the selectable configuration of notch 121, convey identifying information regarding the circuit board 110.

Figure 3:
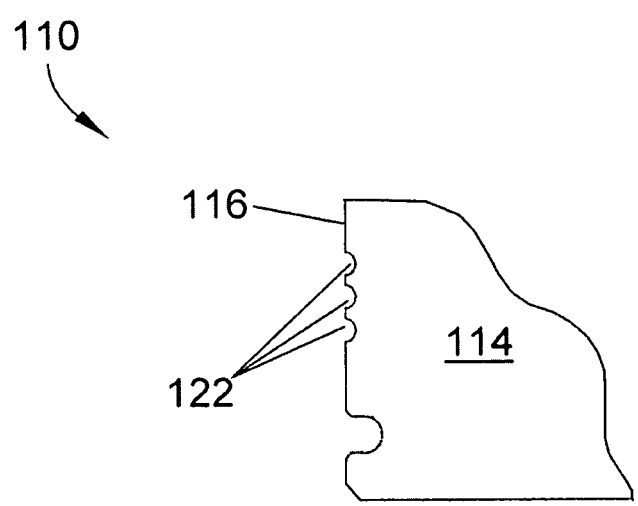

FIG. 3 represents a nonlimiting circuit board 110 having semicircular notches 122 formed in an edge 116 of the board 110 in accordance with certain aspects of the invention. While the notches 122 are shown in a single edge 116, notches 122 may optionally be located on multiple or all edges of the circuit board 110. In one embodiment, the edge 116 is along the perimeter of the surface. 114 of the circuit board 110, and therefore may be considered a lateral or outer edge of the surface 114 of the circuit board 110. The notches 122 are represented as a series or row of three identical notches 122 that are substantially equally spaced from each other. The size and spacing of the notches 122 can be utilized to convey certain identifying information relating to the board 110. The manner in which the notches 122 represent identifying information can be achieved in various ways, such as but not limited to the number, sizes, shapes, locations, spacing, etc., of the notches 122, as well as the presence or absence of notches 122. As such, identifying information can be conveyed through the number of notches 122 along the edge, and as a result of each notch 122 being formed to have a predetermined shape, size, or location on or near the edge 116. Although the notches 122 are represented herein as being semicircular in shape, it is within the scope of the invention that the notches 122 could be formed to have other shapes, such as but not limited to rectangular, triangular, etc., or a combination of shapes.

According to a preferred but nonlimiting aspect of the invention, individual notches 122 may be of a size that enables them to be detected both visually and by touch, for example, with the human hand while the board 110 is installed in a computer housing that limits the accessibility of the board 110. The sizes of the notches 122 may be chosen on the basis of the size needed for the notches 122 to be distinct and easily read versus potential drawbacks resulting from the notches 122 encroaching into the surface 114 of the board 110 where pads, traces, components, and other circuitry, are or will be present.

Figure 5:
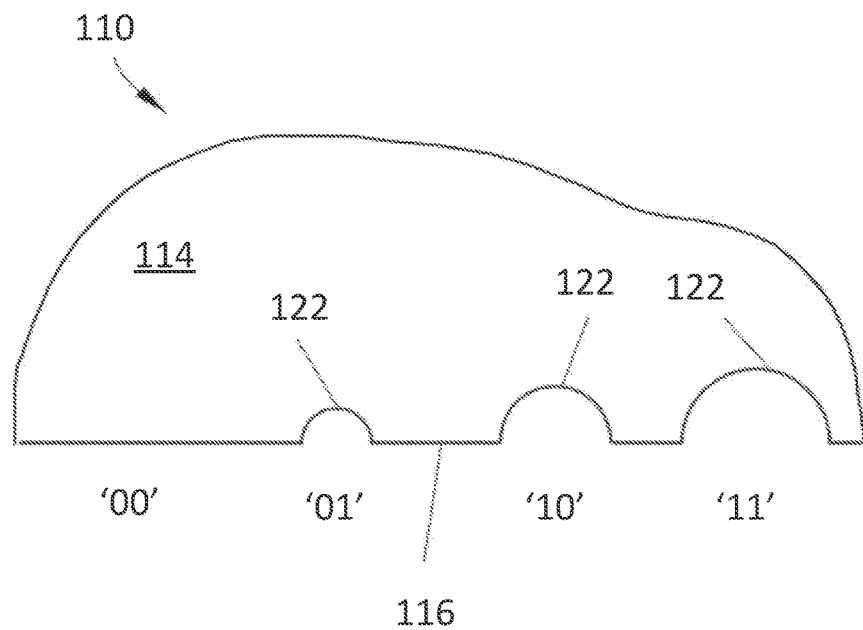
Figure 4:
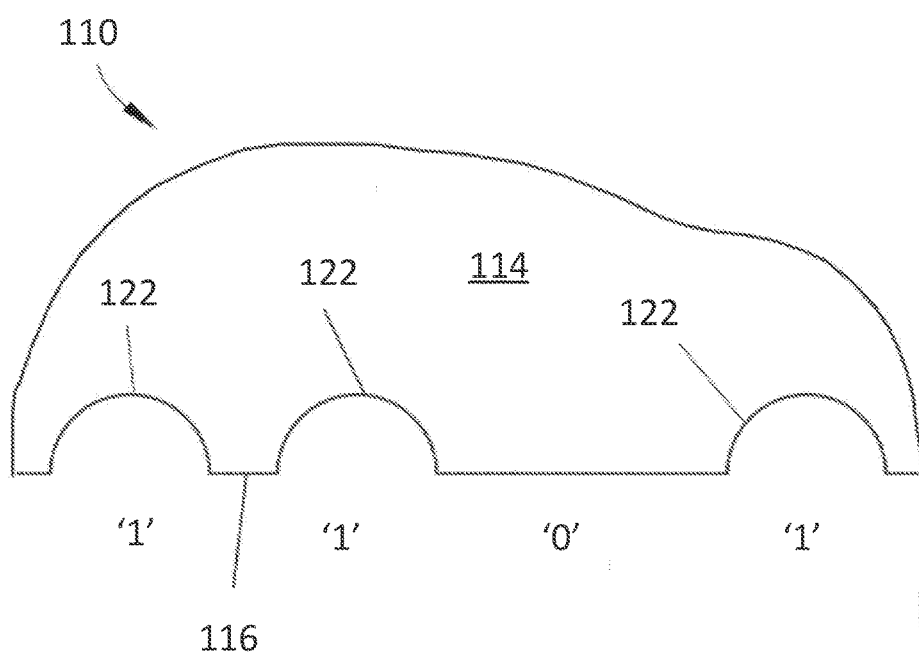

FIGS. 4 and 5 represent nonlimiting examples of semicircular notches 122 formed in edges 116 of a circuit board 110. FIG. 4 represents the notches 122 as representing binary identifying information (1's and 0's) based on their absence and/or presence along the edge 116. For example, based on a template pattern of substantially equally spaced predetermined locations for notches 122 along the edge 116 of the board, the presence of a notch 122 at a predetermined location may indicate a '1' and the absence of a notch 122 at a predetermined location may indicate a '0', or vice versa. FIG. 5 represents the size of the notches 122, in addition to their presence or absence at substantially equally spaced predetermined locations, as representing binary identifying information. For example, the absence of a notch 122 may indicate 00, and notches 122 of progressively larger sizes (diameters) may indicate 01, 10, and 11, respectively. In these examples, the number, size, and locations of the notches 122 (or absence thereof) may be visually read or detected by touch to convey identifying information relating the circuit board.

FIG. 6A represents a plan view of a portion of a panel 112, in which two circuit boards 110 can be seen as separated by a partition feature 120, for example, a V-score or slot, that defines opposing borders (if a V-score) or edges (if a slot) 116 of the boards 110. Alternatively, it should be understood that either region of the panel 112 identified as a board 110 in FIG. 6A could be a frame portion of the panel 112. Suitable width dimensions and geometries for the partition feature 120 will depend on the type of feature 120 and characteristics of the panel 112 and its board(s) 110, for example, their material and thickness. As nonlimiting examples, V-scores are often less than a millimeter in width, whereas slots are often wider, for example, one or more millimeters in width. A V-score can comprise grooves, channels, troughs, etc., (hereinafter channels) formed in opposing surfaces of the panel 112. Alternatively, a V-score can be defined by a groove formed in only one surface of the panel 112. In addition, a V-score may be formed such that the grooves are laterally offset from each other (i.e., in directions lying in the plane of the panel 112). Finally, V-scores may have a wide variety of cross-sectional shapes, and are not limited to the V-shaped grooves described herein.

in FIG. 6A, a series of circular holes 124a-d has been drilled so as to intersect the partition feature 120 and encroach into the surface 114 of at least one of the boards 110. As evident from FIG. 6A, the sizes (diameters) of the holes 124a-d may be completely independent of the width of the partition feature 120, as the axes of the holes 124*a-d* need not intersect a centerline 126 of the feature 120. The uppermost hole 124*a* (as viewed in FIG. 6A) is represented as being formed so that its axis intersects the centerline 126 of the partition feature 120, whereas the holes 124*b*, 124*c*, and 124*d* are represented as being formed in locations offset in a direction toward the righthand circuit board 110 (as viewed in FIGS. 6A and 6B), in particular, so that their axes do not intersect the centerline 126 and, in the nonlimiting examples portrayed, intersect the edge/border 116 of the righthand board 110. The hole 124*a* is sufficiently large to exceed the width of the feature 120 and encroach on the surfaces 114 of both circuit boards 110. The diameters of the holes 124*a* and 124*b* are equal, whereas the holes 124*c* and 124*d* have progressively smaller diameters. Though as large as the uppermost hole 124*a*, the hole 124*b* encroaches on the surface 114 of the righthand board 110 but only slightly encroaches on the surface 114 of the lefthand board 110. The remaining holes 124*c* and 124*d* are sufficiently small in relation to the partition feature 120 to only encroach on the surface 114 of the righthand board 110.

FIG. 6B represents the circuit boards 110 following their separation along the partition feature 120. As shown, the large uppermost hole 124*a* has defined two notches 122*a'* and 122*a"* of equal size and radii in the resulting edges 116 of the boards 110, whereas the hole 124*b*, though of equal size to the hole 124*a*, has defined a larger single notch 122*b"* in the righthand board 110 and only a slight notch 122*b'* in the lefthand board 110. The remaining holes 124*c* and 124*d* have defined notches 122*c* and 122*d* of progressively smaller size (radii) in only the righthand board 110. In this manner, the pattern or series of holes 124*a-d* formed in the panel 112 has served to form notches 122 of varying sizes, which are readable by sight or touch to convey identifying information relating to both of the circuit boards 110.

FIGS. 6A and 6B illustrate that a single hole 124*a* can serve to simultaneously produce two notches 122 on the opposing edges 116 of two adjacent circuit boards 110. In doing so, if the circuit boards 110 within the panel 112 are identically oriented, the notches 122 will be located on different edges 116 of the finished circuit boards 110, e.g., the right edge 116 of the lefthand board 110 and the left edge 116 of the righthand board 110. However, if desired, the boards 110 could be arranged in a mirrored layout on the panel 112 such that a single hole 124 creates notches 122 on the same edges 116 of two separate boards 110 (i.e., the left edge 116 of one board 110 may be adjacent the left edge 116 of the other board 110).

Figure 7A:
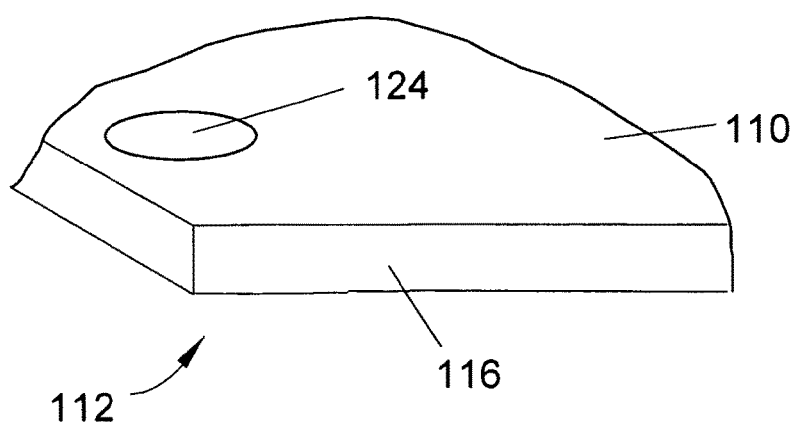
Figure 7B:
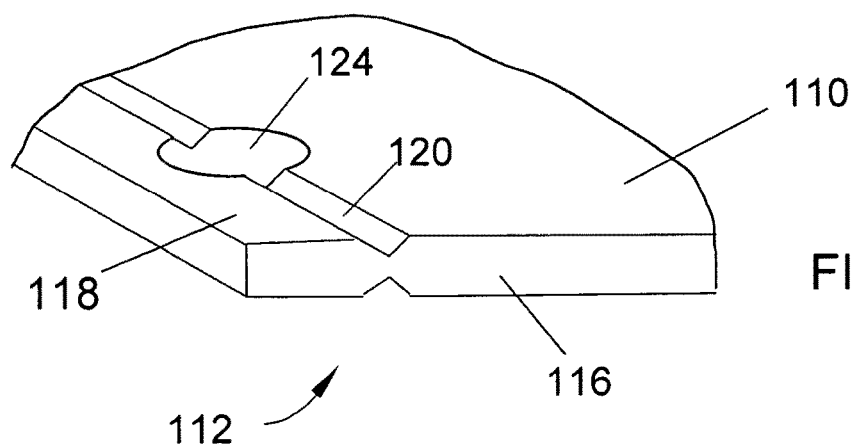
Figure 7C:
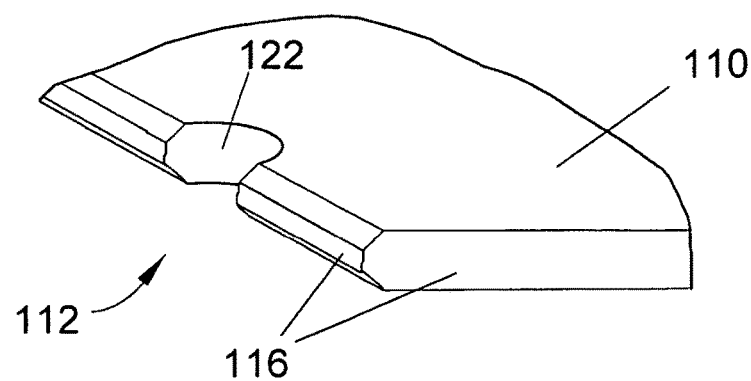
Figure 8A:
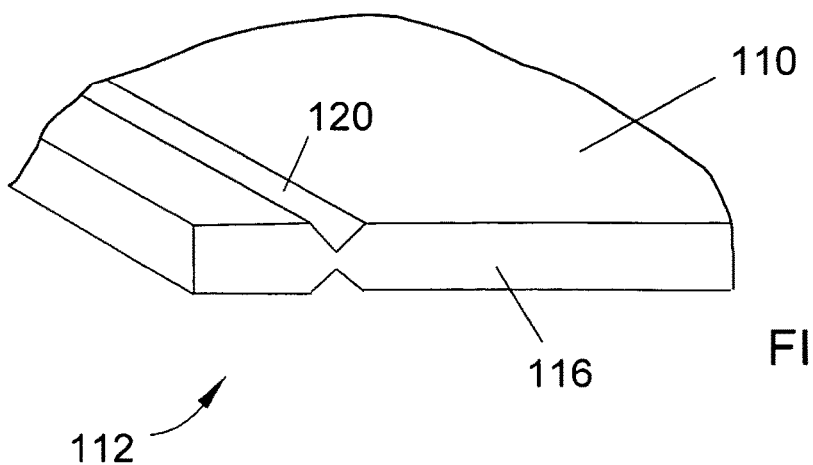
Figure 8B:
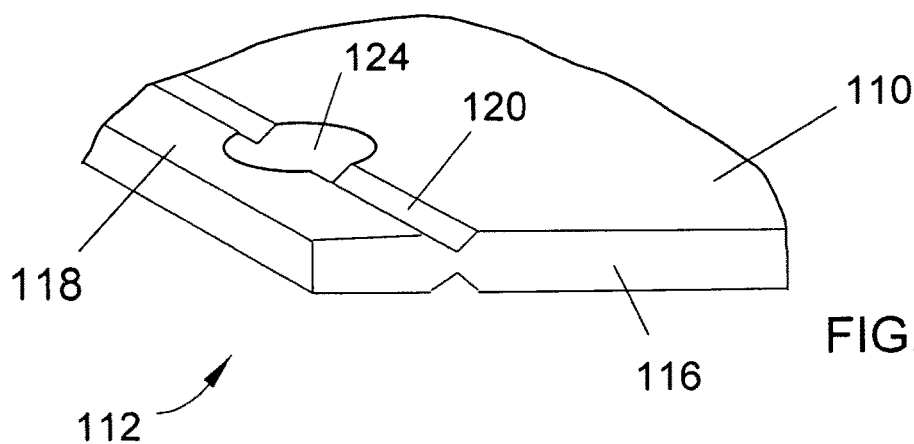
Figure 8C:
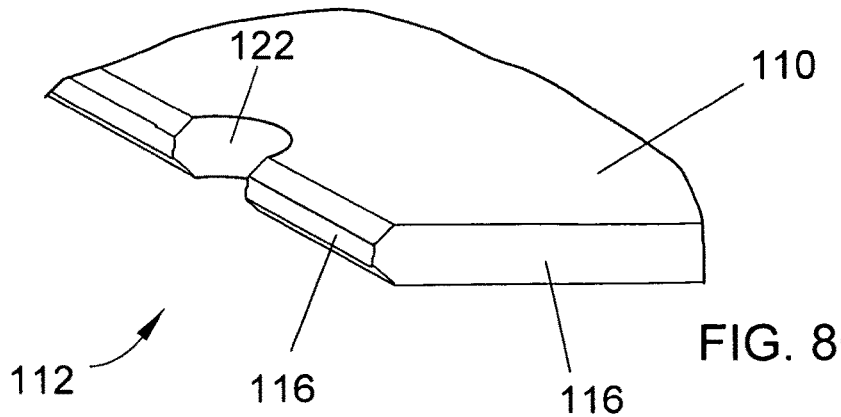
Figure 9A:
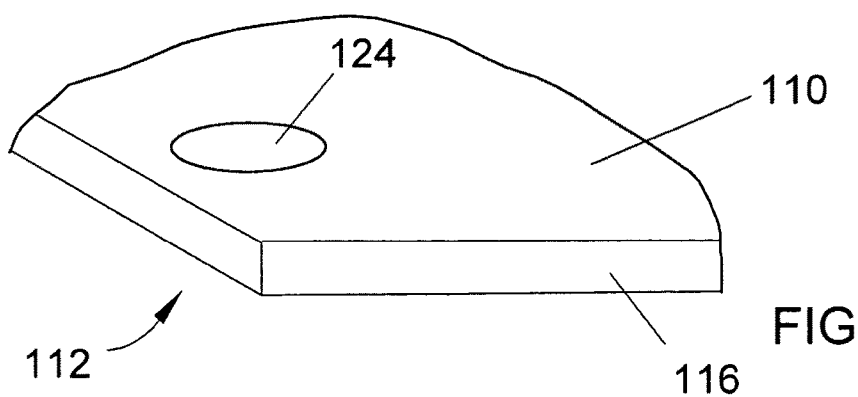
Figure 9B:
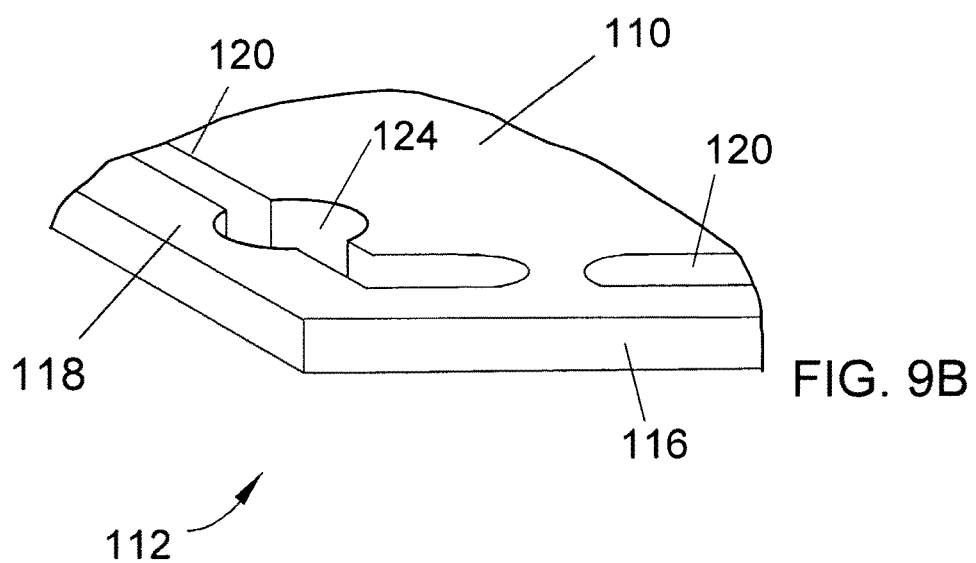
Figure 9C:
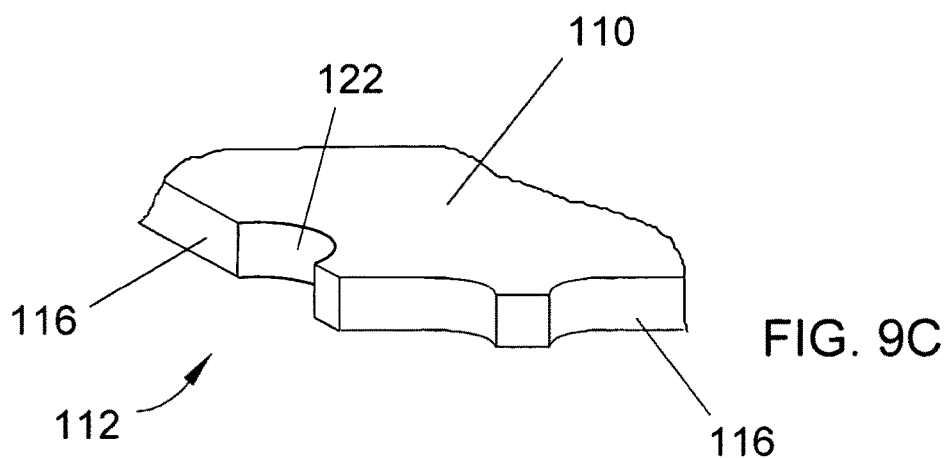
Figure 10A:
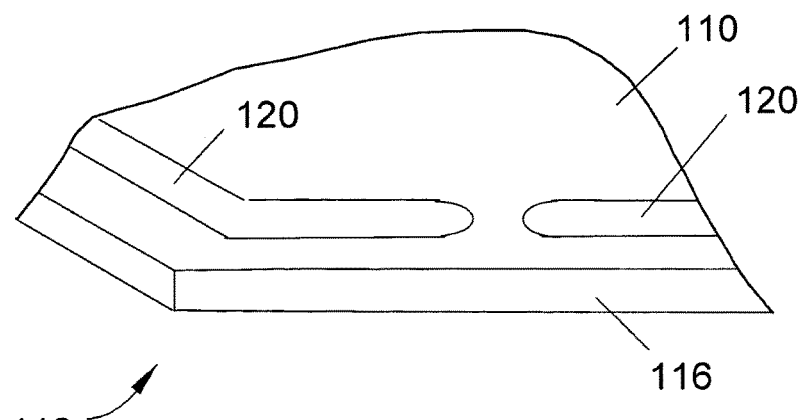
Figure 10B:
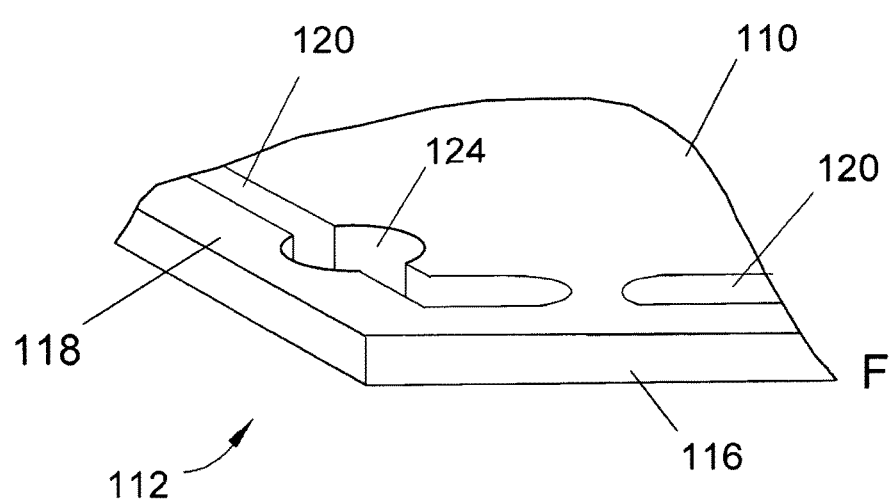
Figure 10C:
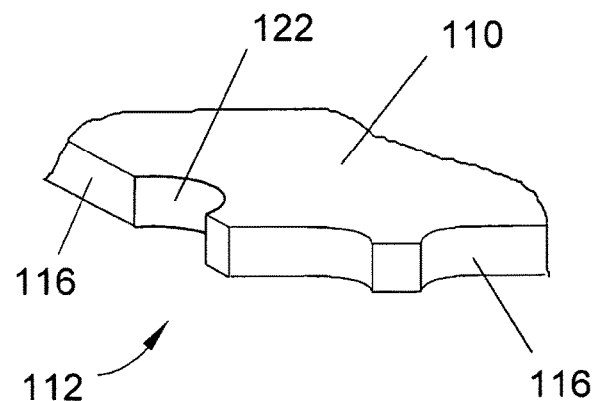

Holes 124 intended to form notches 122 of the types shown in FIGS. 3, 4, 5 and 6B may be formed by any suitable process known in the art, for example, drilling, punching, etc., and, depending on the type of partition feature 20, at appropriate times during the processing of the panel 112. As a nonlimiting example, the holes 124 may be formed before or after the partition feature 120 has been formed in the panel 112 from which the boards 110 are produced. For example, FIGS. 7A-7C represent a hole 124 being formed in a portion of a panel 112 prior to the panel 112 being scored to create a V-score as the partition feature 120, and FIGS. 9A-9C represent a hole 124 being formed in a portion of a panel 112 prior to the panel 112 being milled to create slots as partition features 120 as part of a milling process. Once the board 110 has been separated from a frame portion 118 of the panel 112, a portion of the hole 124 that overlapped the border/edge 116 of the board 110 and encroached into its surface 114 will remain and thereby define a notch 122 in a "new" edge 116 of the board 110 created by removing the board 110 from its frame portion 118 at the partition feature 120. Alternatively, FIGS. 8A-8C and 10A-10C represent portions of panels 112 in which holes 124 were formed after the panels 112 were scored to create either a V-score or slots as the partition feature 120. As evident from comparing FIGS. 7C, 8C, 9C, and 10C, the end result can be essentially the same with each of these approaches.

According to certain aspects of the invention, the holes 124 can be drilled during a conventional drilling stage in the circuit board manufacturing process. That is, the holes 124 can be drilled at the same processing step at which other holes are formed in the panel 112, for example, holes that are made to form plated through-holes in the circuit boards 110. By forming the holes 124 at this time in the circuit board production process, notches 122 can be formed in circuit boards 110 without any additional steps. Notably, the holes 124 are preferably not plated and are not electrically connected to any active components or layers of the boards 110. While the holes 124 may be of any desired size, as a matter of convenience it may be desirable to produce the holes 124 with a drill bit used to form other holes in the panel 112 during the manufacturing process. By using drill bits that are already intended for use in the manufacturing process, notches 122 can be produced with minimal additional time and expense added to the process of producing a circuit board.

Circuit boards 110 comprising notches 122 as described above may further include identification markings of the type conventionally used to identify circuit boards and their components, for example, model numbers, manufacturers, component placements, part numbers or names, date codes, logos, production runs, etc. However, it is foreseeable that notches 122 may be capable of conveying all of these types of identifying information and that such conventional markings may be unnecessary and redundant. It should be understood from the foregoing discussion that the configuration, i.e., size, shape, and/or location on an edge of the circuit board, of the notches are important to the present invention. It is through these selectable variations (or similarities) in the notch configurations that the notches are configured to convey identification information of the circuit board. As such, it is within the scope of the invention that the only identifying information on a circuit board is provided with the notches 122, that is, traditional identifiers are not printed or otherwise formed on the circuit board. In such instances, the limited space on the surface of a circuit board may be used for functional components rather than identification markings. In addition, if such additional markings are unnecessary, the additional production steps, time, and expense traditionally incurred when applying these markings can be avoided.

According to certain nonlimiting aspects of the invention, the notches 122 may be physically read by touch, for example, by feeling with a hand along the edge 116 of a circuit board 110. As such, it is foreseeable that during inspection of a board, one could identify the circuit board and/or functions/aspects thereof without removing the board from its installed location. Such aspects are particularly beneficial in low light conditions or when a circuit board is difficult to visually view from certain angles. It is believed that the notches 122 will have little or no impact on the functionality of a circuit board, as circuit boards traditionally have surface areas at their perimeter that do not include active components or internal layers of the panel in order to provide clearance at their edges to prevent damage to the components thereon.

While the invention has been described in terms of specific embodiments, it is apparent that other forms could be adopted by one skilled in the art. For example, the physical configuration of the circuit boards could differ from that shown, and materials and processes/methods other than those noted could be used. Therefore, the scope of the invention is to be limited only by the following claims.

The invention claimed is:

1. A circuit board comprising:
   a surface configured to receive circuitry;
   a first notch of a first selectable configuration formed in a first lateral edge of the surface,
   wherein the first selectable configuration is configured to convey identifying information that identifies aspects relating to the circuit board; and
   at least a portion of a partition feature intersecting with the first notch.

2. The circuit board according to claim 1, wherein the first selectable configuration includes at least one of a location along the first lateral edge of the surface, a size, or a shape of the first notch.

3. The circuit board according to claim 2, further comprising a second notch of a second selectable configuration formed in a second lateral edge of the surface, wherein the second selectable configuration is configured to convey identifying information that identifies the aspects relating to the circuit board.

4. The circuit board according to claim 3, wherein the second selectable configuration includes at least one of a location along the second lateral edge of the surface, a size, or a shape of the second notch.

5. The circuit board according to claim 4, wherein the first selectable configuration has at least one of a different size, shape, or location from the second selectable configuration.

6. The circuit board according to claim 3, further comprising at least one additional notch, wherein each notch of the at least one additional notch has a selectable configuration on a third lateral edge of the surface and each selectable configuration is configured to convey identifying information that identifies aspects relating to the circuit board.

7. The circuit board according to claim 3, wherein the first edge and second edge are a same edge of the surface.

8. A method of manufacturing a circuit board, the method comprising:
   forming a first notch, having a first selectable configuration, on a perimeter of a surface of a first circuit board such that the first notch is located within the surface the first circuit board;
   configuring the first selectable configuration to convey identifying information that identifies aspects relating to the first circuit board;
   forming a first hole on or near the perimeter of the first circuit board such that the first hole is located within the surface of the first circuit board; and
   forming a partition feature in a panel that contains the first circuit board,
   wherein the partition feature and the first hole intersect.

9. The method according to claim 8, wherein forming the first hole further comprises drilling the first hole through the surface of the first circuit board.

10. The method according to claim 8, wherein forming the partition feature further comprises cutting a slot through the panel along the perimeter of the first circuit board.

11. The method according to claim 8, wherein forming the first notch further comprises:
    separating the first circuit board from the panel along the partition feature so that the perimeter of the separated first circuit board defines a first lateral edge, and the first hole defines the first notch in the first lateral edge.

12. The method according to claim 8, wherein forming the partition feature further comprises cutting a groove in a surface of the panel along the perimeter of the first circuit board.

13. The method according to claim 8, further comprising:
    providing a second circuit board on the panel, wherein the second circuit board has a second surface with a perimeter, and the perimeters of the first and second circuit boards adjoin the partition feature;
    forming a second notch having a second selectable configuration on the perimeter of the second circuit board such that the second notch is located within the second surface of the second circuit board; and
    configuring the second selectable configuration to convey identifying information that identifies aspects relating to the second circuit board.

14. The method according to claim 13, wherein forming the second notch further comprises:
    forming a second hole on or near the perimeter of the second circuit board,
    wherein the partition feature and the second hole intersect.

15. The method according to claim 13, further comprising: separating the second circuit board from the panel along the partition feature so that the perimeter of the second circuit board defines a second lateral edge, and the second hole is formed in the second lateral edge.

16. The method according to claim 8, further comprising forming the partition feature after the first hole is formed.

17. The method according to claim 8, further comprising forming the partition feature before the first hole is formed.

18. The method according to claim 8, wherein the partition feature partitions the surface of the first circuit board from a frame portion of the panel the method further comprising separating the first circuit board from the frame portion of the panel at the partition feature.

19. The method according to claim 8, further comprising:
    forming a second notch having a second selectable configuration on the perimeter of the first circuit board such that the second notch is located within the surface of the first circuit board; and
    configuring the second selectable configuration to convey identifying information that identifies aspects relating to the first circuit board.

20. The circuit board according to claim 1, further comprising a plurality of notches including the first notch, the plurality of notches formed in the first lateral edge of the surface and having a plurality of different sizes or shapes, or both, wherein a combination of one or more of the plurality of notches are configured to convey information relating to the circuit board.

* * * * *